United States Patent
Suzuki et al.

(10) Patent No.: US 11,626,492 B2
(45) Date of Patent: Apr. 11, 2023

(54) SEMICONDUCTOR EPITAXIAL WAFER AND METHOD OF PRODUCING THE SAME

(71) Applicant: SUMCO CORPORATION, Tokyo (JP)

(72) Inventors: Akihiro Suzuki, Tokyo (JP); Takeshi Kadono, Tokyo (JP); Ryo Hirose, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 106 days.

(21) Appl. No.: 17/432,342

(22) PCT Filed: Feb. 7, 2020

(86) PCT No.: PCT/JP2020/004977
§ 371 (c)(1),
(2) Date: Aug. 19, 2021

(87) PCT Pub. No.: WO2020/170875
PCT Pub. Date: Aug. 27, 2020

(65) Prior Publication Data
US 2022/0157948 A1     May 19, 2022

(30) Foreign Application Priority Data
Feb. 22, 2019   (JP) .............................. JP2019-030929

(51) Int. Cl.
*H01L 21/265*     (2006.01)
*H01L 29/36*      (2006.01)

(52) U.S. Cl.
CPC ........ *H01L 29/36* (2013.01); *H01L 21/26506* (2013.01)

(58) Field of Classification Search
None
See application file for complete search history.

(56) References Cited

U.S. PATENT DOCUMENTS 10,396,120 B2 *   8/2019   Kadono .................. C30B 29/06
10,872,768 B2 *  12/2020   Masada ............. H01L 21/02381
(Continued)

FOREIGN PATENT DOCUMENTS

CN      107078029 A    8/2017
JP      H11-251322 A   9/1999
(Continued)

OTHER PUBLICATIONS

Office Action issued in KR Patent Application No. 10-2021-7026406, dated Sep. 7, 2022, English translation.
(Continued)

*Primary Examiner* — Jack S Chen
(74) *Attorney, Agent, or Firm* — Greenblum & Bernstein P.L.C.

(57) ABSTRACT

Provided is a method of producing a semiconductor epitaxial wafer having enhanced gettering ability. The method of producing a semiconductor epitaxial wafer includes: a first step of irradiating a surface of a semiconductor wafer with cluster ions containing carbon, hydrogen, and nitrogen as constituent elements to form a modified layer that is located in a surface portion of the semiconductor wafer and contains the constituent elements of the cluster ions as a solid solution; and a second step of forming an epitaxial layer on the modified layer of the semiconductor wafer.

7 Claims, 6 Drawing Sheets

(56) References Cited

U.S. PATENT DOCUMENTS

| | | | |
|---|---|---|---|
| 11,195,716 B2* | 12/2021 | Okuyama | H01L 21/26566 |
| 11,245,014 B2* | 2/2022 | Kadono | H01L 27/14636 |
| 2003/0003692 A1 | 1/2003 | Suzuki et al. | |
| 2011/0298083 A1 | 12/2011 | Yoneda | |
| 2014/0080247 A1 | 3/2014 | Kadono et al. | |
| 2017/0256668 A1 | 9/2017 | Okuyama et al. | |

FOREIGN PATENT DOCUMENTS

| | | |
|---|---|---|
| JP | 2002-368001 A | 12/2002 |
| JP | 2010-258083 A | 11/2010 |
| JP | 2010-283022 A | 12/2010 |
| JP | 2011-253983 A | 12/2011 |
| JP | 2017-157613 A | 9/2017 |
| JP | 2018-182211 A | 11/2018 |
| JP | 2019-004034 A | 1/2019 |
| KR | 10- 2014-0023938 | 2/2014 |
| KR | 10-2017-0026669 | 3/2017 |
| WO | 2012/157162 A1 | 11/2012 |

OTHER PUBLICATIONS

ISR issued in WIPO Patent Application No. PCT/JP2020/004977, Apr. 7, 2020, English translation.
Office Action issued in TW Patent Application No. 109105713, dated Oct. 6, 2020, English translation.
IPRP issued in WIPO Patent Application No. PCT/JP2020/004977, Sep. 10, 2021, English translation.

* cited by examiner

FIG. 5
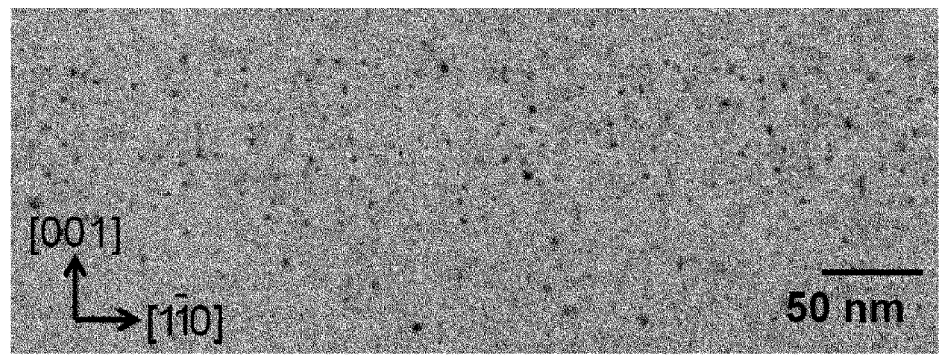
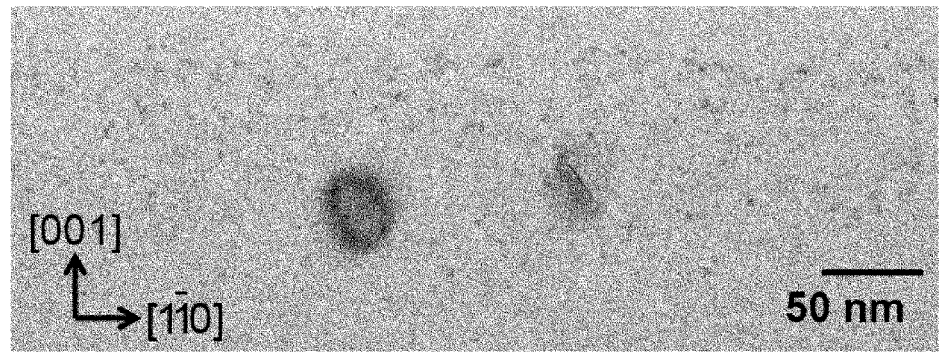

SEMICONDUCTOR EPITAXIAL WAFER AND METHOD OF PRODUCING THE SAME

TECHNICAL FIELD

This disclosure relates to a semiconductor epitaxial wafer and a method of producing the same.

BACKGROUND

Semiconductor epitaxial wafers in which an epitaxial layer is formed on a semiconductor wafer typified by a silicon wafer are used as device substrates for producing various semiconductor devices such as metal oxide semiconductor field-effect transistors (MOSFETs), dynamic random access memories (DRAMs), power transistors, and back-illuminated solid-state image sensing devices.

Here, metal contamination is one of the factors that deteriorate the characteristics of a semiconductor device. For example, for a back-illuminated solid-state image sensing device, metal mixed into a semiconductor epitaxial wafer to be a substrate of the device causes increased dark current in the solid-state image sensing device, and results in the formation of defects referred to as white spot defects. In recent years, back-illuminated solid-state image sensing devices have been widely used in digital video cameras and mobile phones such as smartphones, since they can directly receive light from the outside, and take sharper images or motion pictures even in dark places and the like due to the fact that a wiring layer and the like thereof are disposed in a layer below a sensor area. Accordingly, it is desirable to reduce white spot defects as much as possible.

Mixing of metal into a wafer mainly occurs in a process of producing a semiconductor epitaxial wafer and a process of producing a solid-state image sensing device (device fabrication process). Metal contamination in the former process of producing a semiconductor epitaxial wafer may be due to heavy metal particles from the components of an epitaxial growth furnace, or heavy metal particles produced by the metal corrosion of piping materials of the furnace due to chlorine-based gas used in the furnace during epitaxial growth. In recent years, such metal contaminations have been reduced to some extent by replacing components of epitaxial growth furnaces with highly corrosion resistant materials, but not to a sufficient extent. On the other hand, in the latter process of producing a solid-state image sensing device, heavy metal contamination of semiconductor substrates would occur in process steps such as ion implantation, diffusion, and oxidizing heat treatment in the producing process.

To inhibit such heavy metal contamination, techniques of forming a gettering site in a semiconductor wafer for capturing heavy metals are used. A known method is implanting ions in a semiconductor wafer and then forming an epitaxial layer. In this method, a region to which the ions are implanted serves as a gettering site.

WO 2012/157162 A (PTL 1) describes a semiconductor epitaxial wafer production method including: a step of irradiating a surface of a semiconductor wafer with cluster ions having constituent elements of carbon and hydrogen, such as $C_3H_3$, to form a modified layer that is located in a surface portion of the semiconductor wafer and that includes the constituent elements of the cluster ions in solid solution; and a step of forming an epitaxial layer on the modified layer of the semiconductor wafer.

CITATION LIST

Patent Literature

PTL 1: WO 2012/157162 A

SUMMARY

Technical Problem

PTL 1 demonstrates that a modified layer formed by irradiation with cluster ions having the constituent elements of carbon and hydrogen can have higher gettering capability than an ion implantation region formed by implantation of carbon monomer ions. However, there is a demand for the provision of semiconductor epitaxial wafers having even higher gettering capability to further improve semiconductor device characteristics.

In view of the above challenge, it could be helpful to provide a semiconductor epitaxial wafer having enhanced gettering capability and a method of producing the same.

Solution to Problem

The inventors of this disclosure made diligent studies to address the above challenge and found the following. Increasing the dose of cluster ions, for example, is an effective method for enhancing the gettering capability of the modified layer in PTL 1. However, an excessive dose would lead to the formation of a large number of epitaxial defects in an epitaxial layer to be formed after that. Therefore, the inventors searched for ways to increase the gettering capability without increasing the dose and contemplated improving the gettering capability by further adding elements other than carbon and hydrogen as the elements included in the cluster ions.

The inventors envisaged the use of cluster ions containing carbon, hydrogen, and nitrogen as constituent elements. Although a nitrogen atom is an atom that does not affect electrical resistivity characteristics, since a nitrogen atom has a larger mass number than a carbon atom, the damage caused by such cluster ions to a semiconductor wafer surface would be greater than the damage caused by cluster ions containing a comparable amount of carbon without nitrogen, thus such cluster ions could increase epitaxial defects. However, experiments made by the inventors demonstrated that a semiconductor epitaxial wafer having excellent gettering capability can be obtained without the formation of epitaxial defects.

This disclosure completed based on the above findings primarily includes the following features.

(1) A method of producing a semiconductor epitaxial wafer, the method comprising:

a first step of irradiating a surface of a semiconductor wafer with cluster ions containing carbon, hydrogen, and nitrogen as constituent elements to form a modified layer that is located in a surface portion of the semiconductor wafer and contains the constituent elements of the cluster ions as a solid solution; and a second step of forming an epitaxial layer on the modified layer of the semiconductor wafer.

(2) The method of producing a semiconductor epitaxial wafer, according to (1) above, wherein numbers of carbon, hydrogen, and nitrogen atoms in the cluster ions are represented by $C_xH_yN_z$, where x is a positive integer of 16 or less, y is a positive integer of 50 or less, and z is a positive integer of 16 or less.

(3) The method of producing a semiconductor epitaxial wafer, according to (1) or (2) above, wherein a dose of the cluster ions is $1\times10^{14}$ ions/cm$^2$ or more and $2\times10^{15}$ ions/cm$^2$ or less.

(4) The method of producing a semiconductor epitaxial wafer, according to any one of (1) to (3) above, wherein a peak concentration in a nitrogen concentration profile in a depth direction of the modified layer after the second step is $1\times10^{18}$ atoms/cm$^3$ or more and $1\times10^{21}$ atoms/cm$^3$ or less.

(5) A semiconductor epitaxial wafer comprising:
a semiconductor wafer;
a modified layer that is located in a surface portion of the semiconductor wafer and contains carbon, hydrogen, and nitrogen as a solid solution within the semiconductor wafer; and
an epitaxial layer formed on the modified layer,
wherein a peak concentration in a carbon concentration profile in a depth direction of the modified layer is $1\times10^{18}$ atoms/cm$^3$ or more and $1\times10^{21}$ atoms/cm$^3$ or less,
a peak concentration in a hydrogen concentration profile in the depth direction of the modified layer is $1\times10^{17}$ atoms/cm$^3$ or more and $1\times10^{19}$ atoms/cm$^3$ or less, and
a peak concentration in a nitrogen concentration profile in the depth direction of the modified layer is $1\times10^{18}$ atoms/cm$^3$ or more and $1\times10^{21}$ atoms/cm$^3$ or less.

(6) The semiconductor epitaxial wafer according to (5) above, wherein half widths of the carbon concentration profile, the hydrogen concentration profile, and the nitrogen concentration profile are all 200 nm or less.

(7) The semiconductor epitaxial wafer according to (5) or (6) above, wherein peak positions in the carbon concentration profile, the hydrogen concentration profile, and the nitrogen concentration profile are all in a depth range of 150 nm or less from a surface of the modified layer.

Advantageous Effect

A method of producing a semiconductor epitaxial wafer according to this disclosure can produce a semiconductor epitaxial wafer having enhanced gettering capability. A semiconductor epitaxial wafer according to this disclosure has enhanced gettering ability.

BRIEF DESCRIPTION OF THE DRAWINGS

In the accompanying drawings:
FIG. 5 presents cross-sectional TEM images of cluster ion implantation regions in Example (CH$_4$N) and Comparative Example (C$_3$H$_5$)

DETAILED DESCRIPTION

Embodiments of this disclosure will now be described in detail with reference to the drawings. Note that in FIG. 1, the thicknesses of a modified layer 14 and an epitaxial layer 16 are exaggerated relative to that of a semiconductor wafer 10 for convenience of description and thus the ratio of the thicknesses differs from the actual ratio.

(Method of Producing Semiconductor Epitaxial Wafer)

Figure 1:
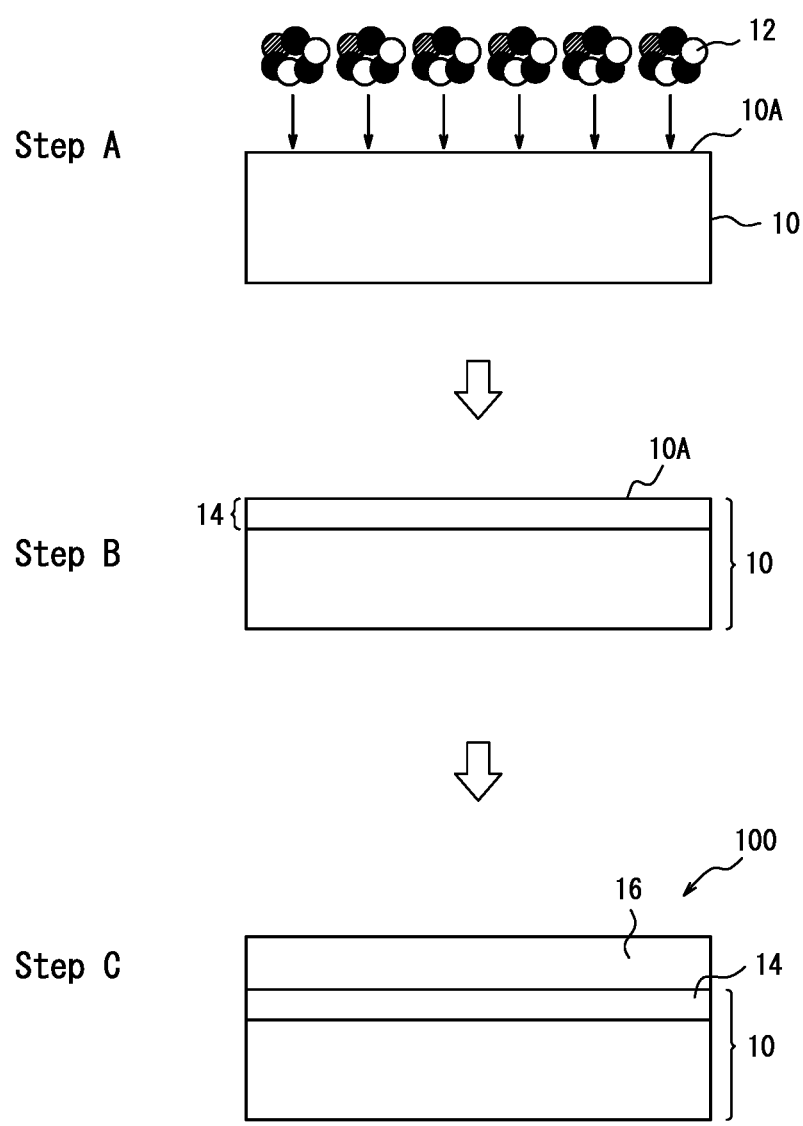
FIG. 1 presents cross-sectional views schematically illustrating steps of a method of producing a semiconductor epitaxial wafer 100, according to one embodiment of this disclosure.

As illustrated in FIG. 1, a method of producing a semiconductor epitaxial wafer 100, according to an embodiment of this disclosure includes: a first step (steps A and B in FIG. 1) of irradiating a surface 10A of a semiconductor wafer 10 with cluster ions 12 containing carbon, hydrogen, and nitrogen as constituent elements to form a modified layer 14 that is located in a surface portion of the semiconductor wafer 10 and contains the constituent elements of the cluster ions 12 as a solid solution; and a second step (step C in FIG. 1) of forming an epitaxial layer 16 on the modified layer 14 of the semiconductor wafer 10. The epitaxial layer 16 forms a device layer for producing a semiconductor device such as a back-illuminated solid-state image sensing device.

[First Step]

The semiconductor wafer 10 is for example a bulk single crystal wafer that is made of silicon or a compound semiconductor (GaAs, GaN, or SiC) and that does not have an epitaxial layer on its surface. When a back-illuminated solid-state image sensing device is produced, a bulk single crystal silicon wafer is typically used. Further, the semiconductor wafer 10 used can be for example obtained by growing a single crystal silicon ingot by the Czochralski process (CZ process) or the floating zone melting process (FZ process) and slicing the ingot using a wire saw or the like. Further, carbon and/or nitrogen may be added to the semiconductor wafer 10 to obtain higher gettering capability. Furthermore, a given dopant may be added to the semiconductor wafer 10 at a predetermined concentration to obtain an n$^+$ type, p$^+$ type, n$^-$ type, or p$^-$ type substrate.

Alternatively, the semiconductor wafer 10 may be an epitaxial semiconductor wafer in which a semiconductor epitaxial layer has been formed on the surface of a bulk semiconductor wafer. For example, the semiconductor wafer 10 may be an epitaxial silicon wafer in which a silicon epitaxial layer is formed on the surface of a bulk single crystal silicon wafer. The silicon epitaxial layer can be formed by CVD under typical conditions. The thickness of the epitaxial layer is preferably in a range of 0.1 μm to 20 μm, more preferably in a range of 0.2 μm to 10 μm. In this case, the semiconductor epitaxial wafer 100 has a plurality of epitaxial layers including the epitaxial layer 16 and an epitaxial layer of a semiconductor wafer not shown.

In the first step, the surface 10A of the semiconductor wafer 10 is irradiated with cluster ions 12 containing carbon, hydrogen, and nitrogen as constituent elements. In this specification, "cluster ions" are obtained by bombarding gaseous molecules with electrons to dissociate the bond of the gaseous molecules by electron impact ionization thereby forming aggregates of atoms having different numbers of atoms; ionizing the aggregates of atoms by causing fragmentation; subjecting the aggregates of atoms having different numbers of atoms having been ionized to mass separation; and extracting the ionized aggregates of atoms having certain mass numbers. Specifically, the "cluster ions" herein are obtained by ionization of clusters by giving positive charges or negative charges to the clusters formed by the aggregation of a plurality of atoms, and such cluster ions are clearly distinguished from monoatomic ions such as carbon ions and monomolecular ions such as carbon monoxide ions. The number of atoms constituting the cluster ions is usually around 5 to 100. As a cluster ion implanting system using such a theory, for example, CLARIS (a registered trademark in Japan, other countries, or both) manufactured by Nissin Ion Equipment Co., Ltd. can be used.

When a silicon wafer as the semiconductor wafer 10 is irradiated with the cluster ions 12 containing carbon, hydrogen, and nitrogen; the irradiation energy instantaneously heats silicon to a high temperature of around 1350° C. to 1400° C. and thus the silicon melts. After that, the silicon is rapidly cooled to form a solid solution of carbon, hydrogen, and nitrogen in the vicinity of the surface of the silicon wafer. Accordingly, the "modified layer" herein means a layer in which carbon, hydrogen, and nitrogen that are the constituent elements of the cluster ions to be shot form a solid solution at crystal interstitial sites or substitutional sites in the crystal lattice sites of the surface portion of the semiconductor wafer. Further, in the concentration profiles of carbon, hydrogen, and nitrogen in the depth direction of the semiconductor wafer, the modified layer is defined as an area in which at least one of the elements is detected to have a sharp peak; in most cases, the area is a surface portion of 500 nm or less from the surface of the semiconductor wafer.

Although depending on the elements used for the irradiation in the form of cluster ions, the elements are thermally diffused to some extent in the course of formation of the epitaxial layer 16 to be described below. When carbon is included in the constituent elements of the cluster ions, in the concentration profile of carbon after the formation of the epitaxial layer 16, broad diffusion regions are formed on both sides of the peak indicating the localization of the carbon element. However, the thickness of the modified layer (that is, the width of the peak) does not change significantly. As a result, carbon can be locally precipitated at a high concentration. The region where carbon is locally precipitated serves as a strong gettering site. Since carbon atoms at lattice sites have a smaller covalent radius than Si atoms in a silicon single crystal, the silicon crystal lattice is compressed and attracts interstitial impurities. Further, since the modified layer 14 is formed in the vicinity of the surface of the silicon wafer, that is, immediately under the epitaxial layer 16; proximity gettering is enabled. Thus, high getting capability is considered to be obtained by the local formation of a solid solution of carbon in the modified layer.

Further, although the details will be described based on the experimental results in Example, the irradiation with cluster ions 12 containing carbon, hydrogen, and nitrogen as constituent elements allows the semiconductor epitaxial wafer 100 to be obtained to have higher gettering capability than the case of performing irradiation with cluster ions having constituent elements consisting of carbon and hydrogen. The inventors believe that the mechanism allowing for such an effect is as follows; however, this disclosure is not limited to this.

According to the studies made by the inventors, implanting monomer nitrogen ions to the surface of the silicon wafer at a dose of approximately $1 \times 10^{15}$ atoms/cm$^2$ followed by rapid heating reduces the nitrogen concentration in the nitrogen concentration profile in the depth direction of the surface portion of the silicon wafer to $3 \times 10^{17}$ atoms/cm$^3$. Thus, nitrogen is regarded as an element that is easily desorbed from the silicon wafer because it is diffused due to heat treatment of a process such as epitaxial growth. By contrast, when the surface of the silicon wafer was irradiated with cluster ions containing carbon, hydrogen, and nitrogen as constituent elements and a silicon epitaxial layer was grown after that, nitrogen was also found to sufficiently remain in the surface portion of the silicon wafer together with the carbon and hydrogen. Accordingly, carbon, hydrogen, and nitrogen are implanted simultaneously in the form of cluster ions to the surface portion of the silicon wafer, thus plenty of nitrogen can be left in the surface portion.

Since the mass number of a nitrogen atom is larger than that of a carbon atom, the damage caused by the irradiation with the cluster ions is considered to be greater, which would increase getting capability. The increase of the irradiation damage may be attributed to the formation of crystal defects newly formed in the region irradiated with the cluster ions. Accordingly, when a cross section of the surface portion of the silicon wafer (modified layer; region to which the cluster ions are implanted) was observed under a transmission electron microscope (TEM) after the epitaxial growth, the form of the crystal defects formed in the implantation region was found to differ between the case of the implantation of the cluster ions having constituent elements consisting of carbon and hydrogen and the case of the implantation of the cluster ions containing carbon, hydrogen, and nitrogen as constituent elements.

Although the details will be described below with reference to FIG. 5, in the former case, many crystal defects with a diameter of approximately 5 nm were observed in the cluster ion implantation region. These crystal defects are assumed to have been formed due to the cohesion of carbon and interstitial silicon. By contrast, in the latter case, in the cluster ion implantation region, in addition to the crystal defects with a diameter of approximately 5 nm defects with a diameter of approximately 50 nm were found to scatter. These defects are considered to cause stacking faults in the Si[111] direction. The formation of such new crystal defects is considered to have improved the getting capability.

The cluster ion irradiation conditions include the cluster size of cluster ions, the dose, the acceleration voltage for cluster ions, and the beam current.

The cluster size can be set to 2 to 100, preferably 60 or less, more preferably 50 or less. "Cluster size" herein means the number of atoms forming one cluster. The cluster size can be adjusted by controlling the pressure of gas ejected from a nozzle, the pressure of a vacuum vessel, the voltage applied to the filament in the ionization, etc. The cluster size is determined by finding the cluster number distribution by mass spectrometry using the oscillating quadrupole field or by time-of-flight mass spectrometry, and finding the mean value of the number of clusters.

Note that in this embodiment, the constituent elements of the cluster ions preferably consist of carbon, hydrogen, and nitrogen, and when the numbers of carbon, hydrogen, and nitrogen atoms in the cluster ions are represented by $C_xH_yN_z$, where preferably, x is a positive integer of 16 or less, y is a positive integer of 50 or less, and z is a positive integer of 16 or less. Such a cluster size is preferred because a beam of small-sized cluster ions can easily be controlled.

Gaseous molecules as a source of the cluster ions are not limited as long as cluster ions having the above cluster size can be obtained. Examples of the gaseous molecules include propylamine ($C_3H_9N$), cyclopropylmethylamine ($C_4H_9N$), N,N dimethylamine ($C_5H_{13}N$), isobutylamine ($C_4H_{11}N$), and piperidine ($C_5H_{11}N$). Note that cluster ions having different sizes are produced from these source gases. For example, although fragments of $CH_4N$ are obtained from propylamine ($C_3H_9N$), minute fragments of methyl ($CH_3$), $CH_2N$, and $C_2H_4N$ are also obtained. One or more desirable cluster ions (fragments) may be extracted from these different sizes of cluster ions to irradiate the surface of the semiconductor wafer.

The dose of the cluster ions can be adjusted by controlling the ion irradiation time. The dose of each element forming the cluster ions is determined by the ion species of the cluster ions and the dose of the cluster ions (ions/cm$^2$). In this embodiment, the dose of the cluster ions is preferably $1\times10^{14}$ ions/cm$^2$ or more and $2\times10^{15}$ ions/cm$^2$ or less. When the dose is particularly $1\times10^{15}$ ions/cm$^2$ or more, the getting capability improving effect can be sufficiently obtained. Further, when the dose is $2\times10^{15}$ ions/cm$^2$ or less, the surface of the semiconductor wafer is not excessively damaged, which can prevent defects from being formed on the surface of the epitaxial layer after the second step.

The dose of carbon is preferably $1\times10^{14}$ atoms/cm$^2$ to $2\times10^{15}$ atoms/cm$^2$, more preferably $1\times10^{15}$ atoms/cm$^2$ or more and $2\times10^{15}$ atoms/cm$^2$ or less. When the carbon dose is $1\times10^{14}$ atoms/cm$^2$ or more, sufficient gettering capability can be obtained; meanwhile, when the carbon dose is $2\times10^{15}$ atoms/cm$^2$ or less, the surface of the semiconductor wafer is not excessively damaged, which can prevent defects from being formed on the surface of the epitaxial layer after the second step.

The dose of hydrogen is preferably $1\times10^{14}$ atoms/cm$^2$ to $2\times10^{16}$ atoms/cm$^2$, more preferably $4\times10^{15}$ atoms/cm$^2$ or more and $8\times10^{15}$ atoms/cm$^2$ or less. When the hydrogen dose is $1\times10^{14}$ atoms/cm$^2$ or more, hydrogen can be left in the modified layer at a high concentration even after the epitaxial layer formation; when the hydrogen dose is $2\times10^{16}$ atoms/cm$^2$ or less, the surface of the epitaxial layer would not be greatly damaged.

The dose of nitrogen is preferably $1\times10^{14}$ atoms/cm$^2$ to $2\times10^{15}$ atoms/cm$^2$, more preferably $1\times10^{15}$ atoms/cm$^2$ or more and $2\times10^{15}$ atoms/cm$^2$ or less. When the nitrogen dose is $1\times10^{14}$ atoms/cm$^2$ or more, sufficient gettering capability can be obtained; meanwhile, when the nitrogen dose is $2\times10^{15}$ atoms/cm$^2$ or less, the surface of the semiconductor wafer is not excessively damaged, which can prevent defects from being formed on the surface of the epitaxial layer after the second step.

The acceleration voltage for the cluster ions, in combination with the cluster size, influences the peak position in the concentration profile of the constituent elements in the depth direction in the modified layer. In this embodiment, the acceleration voltage for the cluster ions can be set to be higher than 0 keV/Cluster and lower than 200 keV/Cluster, preferably 100 keV/Cluster or less, more preferably 80 keV/Cluster or less. The acceleration voltage is typically controlled using two methods: (1) electrostatic acceleration and (2) radiofrequency acceleration. Examples of the former method include a method in which a plurality of electrodes are arranged at regular intervals, and the same voltage is applied between the electrodes, thereby forming a constant acceleration field is formed in an axial direction. Examples of the latter method include a linear accelerator (linac) method in which ions are caused to travel along a straight line while being accelerated by radio waves.

The beam current of the cluster ions can be appropriately determined for example within a range of 50 μA to 5000 μA, but not limited thereto. The beam current of the cluster ions can be adjusted for example by changing the conditions for the decomposition of the source gas in the ion source.

[Second Step]

The epitaxial layer 16 formed on the modified layer 14 is, for example, a silicon epitaxial layer and can be formed under typical conditions. For example, a source gas such as dichlorosilane or trichlorosilane can be introduced into a chamber using hydrogen as a carrier gas and the source material can be epitaxially grown on the semiconductor wafer 10 by CVD at a temperature in a range of approximately 1000° C. to 1200° C., although the growth temperature also depends on the source gas to be used. The epitaxial layer 16 preferably has a thickness in a range of 1 μm to 15 μm. When the thickness is less than 1 μm, the resistivity of the epitaxial layer 16 would change due to the out-diffusion of dopants from the semiconductor wafer 10, whereas a thickness exceeding 15 μm would affect the spectral sensitivity characteristics of the solid-state image sensing device.

The above-described method of producing a semiconductor epitaxial wafer, according to this embodiment can produce a semiconductor epitaxial wafer having enhanced gettering capability.

After the first step before the second step, recovery heat treatment for crystallinity recovery may be performed on the semiconductor wafer 10. For recovery heat treatment in this case, the semiconductor wafer 10 may be maintained in an atmosphere of for example nitrogen gas or argon gas at a temperature of 900° C. or more and 1100° C. or less for 10 min or more and 60 min or less. Further, the recovery heat treatment may be performed using a rapid heating/cooling apparatus for rapid thermal annealing (RTA), rapid thermal oxidation (RTO), or the like, separate from an epitaxial growth apparatus.

(Semiconductor Epitaxial Wafer)

Referring to FIG. 1, the semiconductor epitaxial wafer 100 of this embodiment can be obtained by the above production method, and includes: a semiconductor wafer 10; a modified layer 14 that is located in a surface portion of the semiconductor wafer 10 and contains carbon, hydrogen, and nitrogen as a solid solution in the semiconductor wafer 10; and an epitaxial layer 16 formed on the modified layer 14.

In this embodiment, the peak concentration in the carbon concentration profile in the depth direction of the modified layer 14 is $1\times10^{18}$ atoms/cm$^3$ or more and $1\times10^{21}$ atoms/cm$^3$ or less; the peak concentration in the hydrogen concentration profile in the depth direction of the modified layer 14 is $1\times10^{17}$ atoms/cm$^3$ or more and $1\times10^{19}$ atoms/cm$^3$ or less; and the peak concentration in the nitrogen concentration profile in the depth direction of the modified layer 14 is $1\times10^{18}$ atoms/cm$^3$ or more and $1\times10^{21}$ atoms/cm$^3$ or less. Such a semiconductor epitaxial wafer 100 has higher getting capability. The peak concentration in the carbon concentration profile is preferably $9\times10^{19}$ atoms/cm$^3$ or more. The peak concentration in the hydrogen concentration profile is preferably $1\times10^{18}$ atoms/cm$^3$ or more. The peak concentration in the nitrogen concentration profile is preferably $2\times10^{19}$ atoms/cm$^3$ or more.

Further, the half widths (FWHMs) of the carbon concentration profile, the hydrogen concentration profile, and the nitrogen concentration profile in the depth direction of the modified layer 14 are preferably all 200 nm or less. The modified layer 14 is a region where carbon, hydrogen, and nitrogen are locally present as a solid solution at crystal interstitial sites or substitutional sites in the surface portion of the semiconductor wafer, and can serve as a strong gettering site. Further, in terms of obtaining higher gettering capability, the half widths are more preferably 100 nm or less, and preferably the lower limit thereof is set to 50 nm.

Further, the peak positions in the carbon concentration profile, the hydrogen concentration profile, and the nitrogen concentration profile in the direction of the modified layer 14 are preferably all in a depth range of 150 nm or less from the surface of the modified layer 14 (that is, the surface of the semiconductor wafer 10).

The thickness of the modified layer 14 is defined as the thickness of a region for which the concentration of at least one of carbon, hydrogen, and nitrogen in the concentration profiles of the elements in the depth direction of the semiconductor wafer is observed as a sharp peak, and the thickness can be, for example, within a range of 30 nm to 500 nm.

(Method of Producing Semiconductor Device)

The method of producing a semiconductor device, according to an embodiment of this disclosure includes the steps of the above-described method of producing the semiconductor epitaxial wafer 100 and a step of forming a semiconductor device on the epitaxial layer 16. According to this production method, higher gettering capability can be obtained, which makes it possible to produce a semiconductor device with favorable device characteristics.

EXAMPLES

Example

An n⁻ type silicon wafer obtained from a CZ single crystal silicon ingot (diameter: 300 mm, thickness: 775 μm, dopant: phosphorus, resistivity: 20 Ω·cm) was prepared. Next, $CH_4N$ cluster ions were generated and extracted using propylamine ($C_3H_9N$) as a source gas with the use of a cluster ion generating apparatus (CLARIS produced by Nissin Ion Equipment Co., Ltd.; CLARIS is a registered trademark in Japan, other countries, or both), and were shot on the silicon wafer under irradiation conditions of acceleration voltage: 80 keV/Cluster (acceleration voltage per one hydrogen atom: 2.7 keV/atom, acceleration voltage per one carbon atom: 32 keV/atom, acceleration voltage per one nitrogen atom: 37.3 keV/atom). The dose of the cluster ions shot was $1.0 \times 10^{15}$ ions/cm². The dose was $1.0 \times 10^{15}$ atoms/cm² based on the number of carbon atoms, $4.0 \times 10^{15}$ atoms/cm² based on the number of hydrogen atoms, and $1.0 \times 10^{15}$ atoms/cm² based on the number of nitrogen atoms. Further, the beam current of the cluster ions was set to 1700 μA.

Subsequently, the silicon wafer having been irradiated with the cluster ions was transferred into a single-wafer processing epitaxial growth apparatus (produced by Applied Materials, Inc.) and subjected to hydrogen bake-out at a temperature of 1120° C. for 30 s in the apparatus using hydrogen as a carrier gas, and trichlorosilane as a source gas, followed by CVD at 1120° C., thereby epitaxially growing a silicon epitaxial layer (thickness: 5 μm, dopant: phosphorus, resistivity: 10 Ω·cm) on a surface of the silicon wafer, where the modified layer was formed. Thus, an epitaxial silicon wafer was obtained.

Comparative Example

An epitaxial silicon wafer was obtained in the same manner as in Example except that the conditions for the irradiation with cluster ions were set as follows. Specifically, $C_3H_5$ cluster ions were generated and extracted using cyclohexane ($C_6H_{12}$) as a source gas, and were shot on the silicon wafer under irradiation conditions of acceleration voltage: 80 keV/Cluster (acceleration voltage per one carbon atom: 23.4 keV/atom, and acceleration voltage per one hydrogen atom: 2.0 keV/atom). The dose of the cluster ions shot was $3.3 \times 10^{14}$ ions/cm². The dose was $1.0 \times 10^{15}$ atoms/cm² based on the number of carbon atoms, and was $1.7 \times 10^{15}$ atoms/cm² based on the number of hydrogen atoms. Further, the beam current of the cluster ions was set to 850 μA.

[Evaluation 1: Evaluation of Carbon, Hydrogen, and Nitrogen Concentration Profiles Using SIMS]

The epitaxial silicon wafers obtained in Example and Comparative Example were subjected to the measurements of the concentration profiles of carbon, hydrogen, and nitrogen in the depth direction from the silicon epitaxial layer surface by secondary ion mass spectrometry (SIMS) measurements. As a result, in Example, the modified layer was located in a surface portion of approximately 300 nm (that is, approximately 300 nm from the interface between the silicon epitaxial layer and the silicon wafer) of the silicon wafer. In Comparative Example, the modified layer was located in a surface portion of approximately 400 nm in the silicon wafer.

Figure 2:
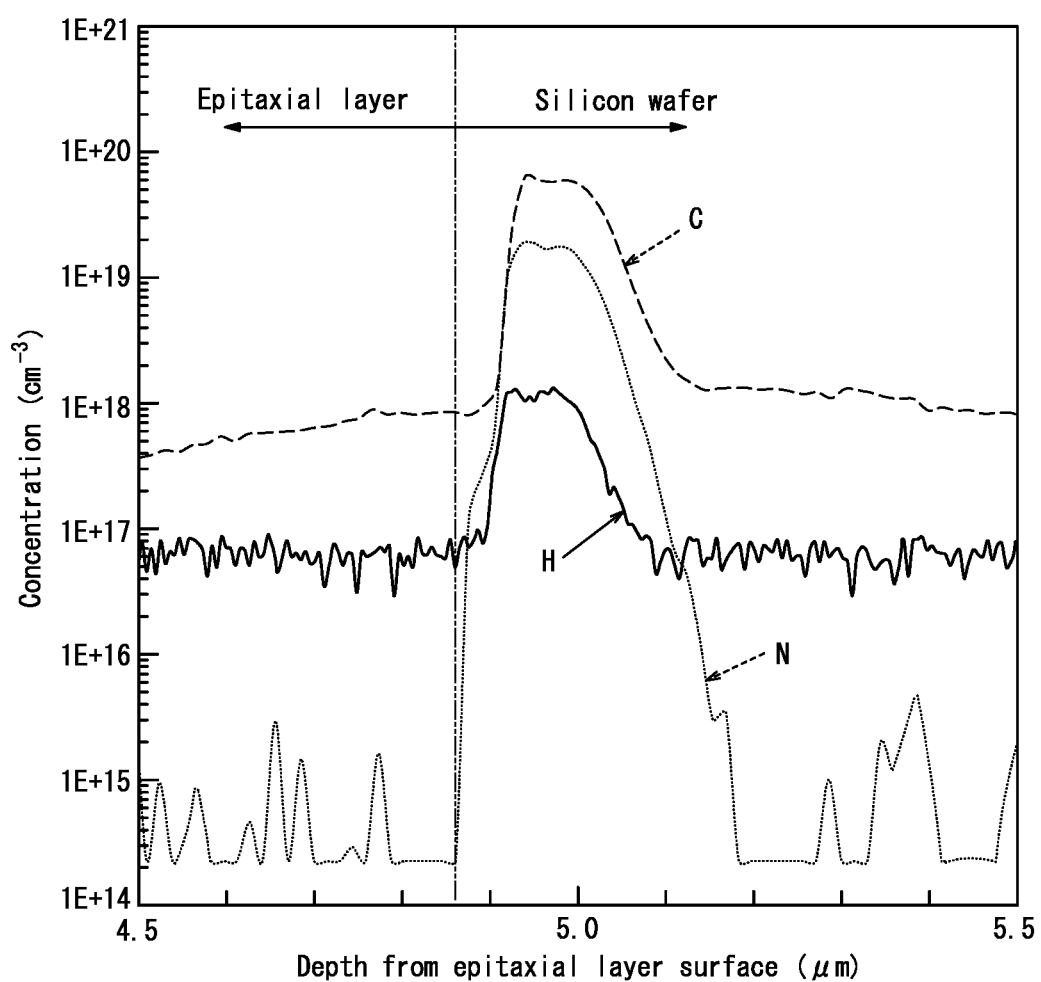
FIG. 2 is a graph illustrating the concentration profiles of carbon, hydrogen, and nitrogen in Example (CH$_4$N)

FIG. 2 illustrates the concentration profiles of carbon, hydrogen, and nitrogen in Example ($CH_4N$). In FIG. 2, the peak concentration in the carbon concentration profile was $9 \times 10^{19}$ atoms/cm³, the peak concentration in the hydrogen concentration profile was $1 \times 10^{18}$ atoms/cm³, and the peak concentration in the nitrogen concentration profile was $2 \times 10^{19}$ atoms/cm³. Further, the half widths of the carbon concentration profile, hydrogen concentration profile, and nitrogen concentration profile were 100 nm, 100 nm, and 100 nm, respectively. Further, the peak positions in the carbon concentration profile, hydrogen concentration profile, and nitrogen concentration profile were observed at depths of 100 nm, 100 nm, and 100 nm, respectively from the surface of the silicon wafer.

[Evaluation 2: Evaluation of Gettering Capability]

Figure 3A:
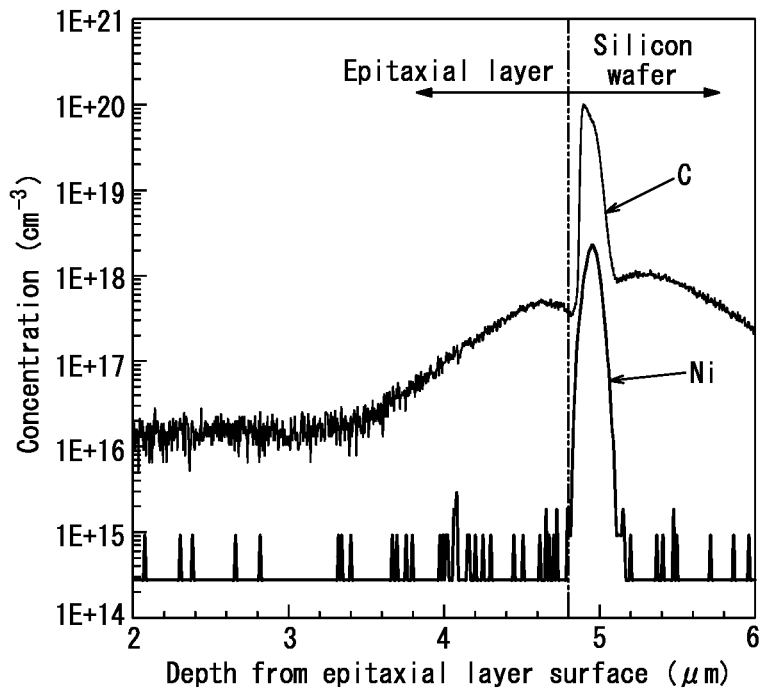
FIG. 3A is a graph illustrating the concentration profiles of carbon and Ni after forced contamination with Ni in Example (CH$_4$N)

The surface of the epitaxial layer of the epitaxial wafer in each of Example and Comparative Example was forcedly contaminated by a spin coating contamination method using Ni contaminant liquid and was then subjected to heat treatment in a nitrogen atmosphere at 900° C. for 30 min. After that, SIMS measurements were performed on the epitaxial wafers to determine the concentration profiles of carbon and Ni in the depth direction of the wafer. The concentration profiles of carbon and Ni in Example are given in FIG. 3A. Further, the amount of Ni captured in each epitaxial wafer, found from the Ni concentration profile is given in FIG. 4.

Figure 3B:
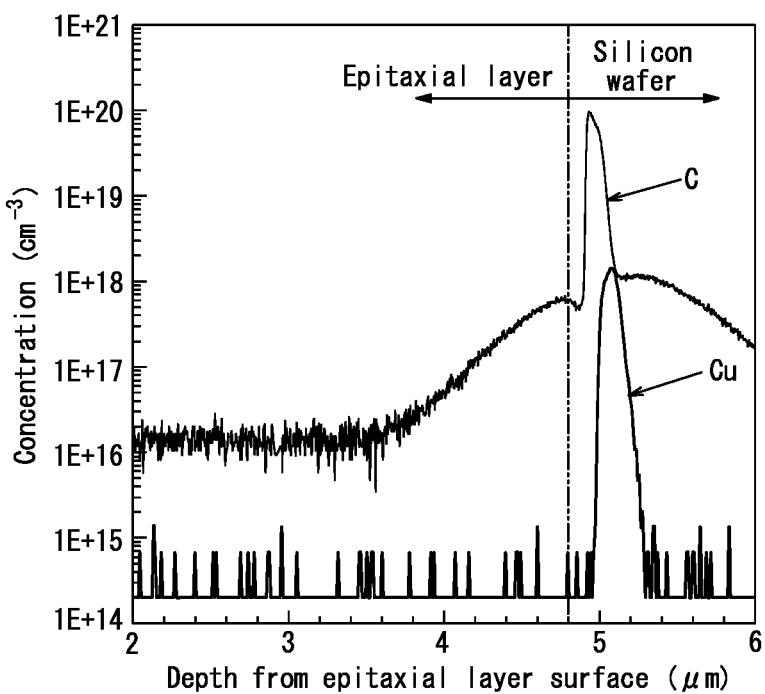
FIG. 3B is a graph illustrating the concentration profiles of carbon and Cu after forced contamination with Cu in Example (CH$_4$N)

A similar test was performed using Cu contaminant liquid, and the concentration profiles of carbon and Cu in Example are given in FIG. 3B. Further, the amount of Cu captured in each epitaxial wafer, found from the Cu concentration profile is given in FIG. 4.

Figure 4:
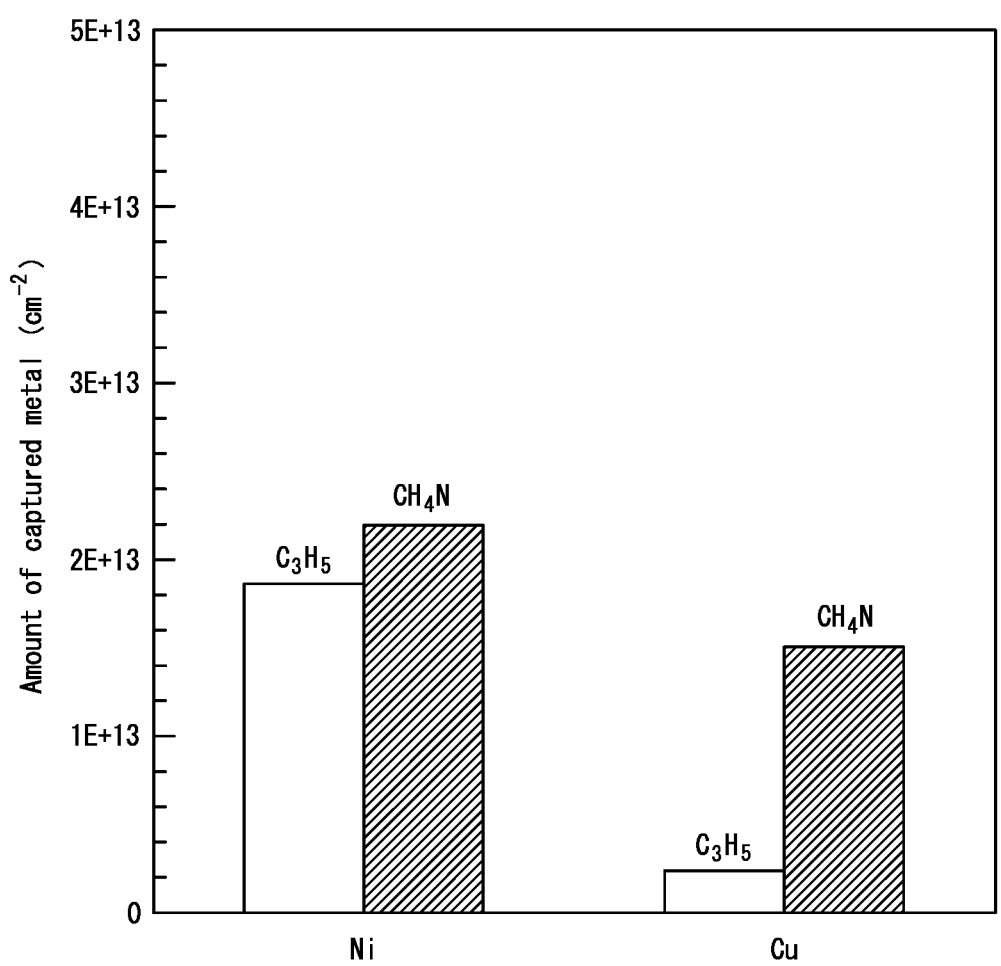
FIG. 4 is a graph illustrating the amounts of Ni and Cu captured in Example (CH$_4$N) and Comparative Example (C$_3$H$_5$)

As apparent from FIG. 4, although the doses of carbon in Example and Comparative Example are the same, the amounts of Ni and Cu captured were larger in Example than in Comparative Example, and higher gettering capability was obtained in Example.

[Evaluation 3: Cross-Sectional TEM Observation on Cluster Ion Implantation Region]

A cross section of an area around the modified layer (cluster ion implantation region) in each epitaxial wafer in Example and Comparative Example was observed by TEM. FIG. 5 presents cross-sectional TEM images under the sets of conditions. As apparent from FIG. 5, in Comparative Example, many crystal defects with a diameter of approximately 5 nm were observed in the cluster ion implantation region. In Example, defects with a diameter of approximately 50 nm were scattered in addition to the crystal defects with a diameter of approximately 5 nm in the cluster ion implantation region. Such new crystal defects are considered to have contributed to the improvement in getting capability. Large defects of such a size were not formed in the implantation of cluster ions having constituent elements consisting of carbon and hydrogen; thus, nitrogen is likely to have contributed to the formation of such large-sized defects.

[Evaluation 4: Evaluation of Damage Concentration Profile by TCAD Simulation]

Figure 6:
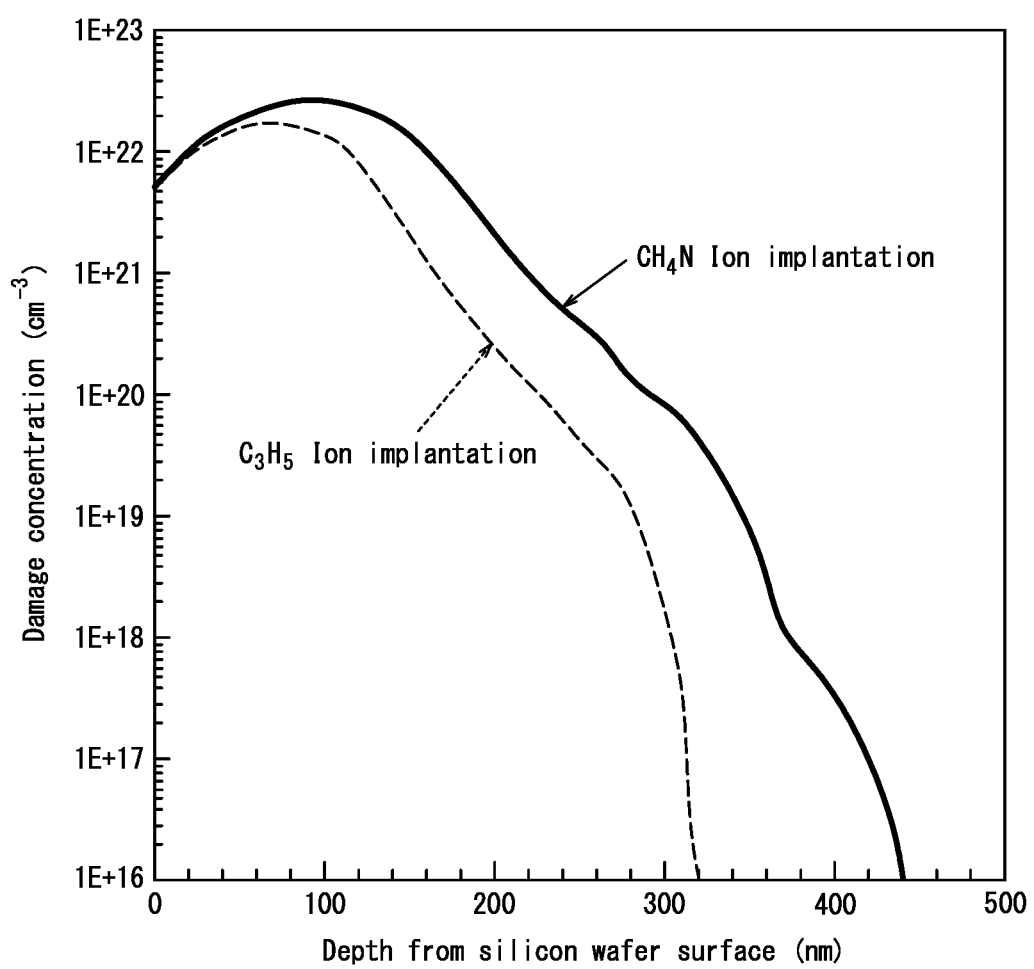
FIG. 6 is a graph illustrating the damage concentration profiles obtained by TCAD simulation in Example (CH$_4$N) and Comparative Example (C$_3$H$_5$).

The concentration of irradiation damage made to the surface portion of each silicon wafer caused by the cluster ion irradiation in Example and Comparative Example was calculated by simulation. Specifically, the profile of the irradiation damage concentration in the depth direction was calculated by TCAD simulator, Sentaurus Process (available from Nihon Synopsys G.K.) capable of calculations based on Monte Carlo (MC) simulation using the ion species for the ion implantation, irradiation energy, dose, beam current, irradiation angle, wafer temperature during the irradiation, and the thickness of a protective oxide film as parameters. Here, the irradiation damage concentration is defined as the sum of the concentration of interstitial silicon atoms and the hole concentration. The results are given in FIG. 6. As apparent from FIG. 6, the concentration of damages formed in the surface portion of the silicon wafer was higher in Example than in Comparative Example, which probably contributed to the improvement in the gettering capability.

[Evaluation 5: Evaluation of Epitaxial Defects]

The surface of the epitaxial layer in each of Example and Comparative Example was subjected to measurements using the Surfscan SP1 (manufactured by KLA-Tencor Corporation) in normal mode, and of the defects counted as LPDs of at least 90 nm, each defect counted as an LPD-N was defined as an epitaxial defect. As a result, no epitaxial defects were observed in the epitaxial wafer of either Example or Comparative Example.

INDUSTRIAL APPLICABILITY

A method of producing a semiconductor epitaxial wafer according to this disclosure can produce a semiconductor epitaxial wafer having enhanced gettering capability. A semiconductor epitaxial wafer according to this disclosure has enhanced gettering ability.

REFERENCE SIGNS LIST

100: Semiconductor epitaxial wafer
10: Semiconductor wafer
10A: Surface of semiconductor wafer
12: Cluster ion
14: Modified layer
16: Epitaxial layer

The invention claimed is:

1. A method of producing a semiconductor epitaxial wafer, the method comprising:
a first step of irradiating a surface of a semiconductor wafer with cluster ions containing carbon, hydrogen, and nitrogen as constituent elements to form a modified layer that is located in a surface portion of the semiconductor wafer and contains the constituent elements of the cluster ions as a solid solution; and
a second step of forming an epitaxial layer on the modified layer of the semiconductor wafer.

2. The method of producing a semiconductor epitaxial wafer, according to claim 1, wherein numbers of carbon, hydrogen, and nitrogen atoms in the cluster ions are represented by $C_xH_yN_z$, where x is a positive integer of 16 or less, y is a positive integer of 50 or less, and z is a positive integer of 16 or less.

3. The method of producing a semiconductor epitaxial wafer, according to claim 1, wherein a dose of the cluster ions is $1\times10^{14}$ ions/cm$^2$ or more and $2\times10^{15}$ ions/cm$^2$ or less.

4. The method of producing a semiconductor epitaxial wafer, according to claim 1, wherein a peak concentration in a nitrogen concentration profile in a depth direction of the modified layer after the second step is $1\times10^{18}$ atoms/cm$^3$ or more and $1\times10^{21}$ atoms/cm$^3$ or less.

5. A semiconductor epitaxial wafer comprising:
a semiconductor wafer;
a modified layer that is located in a surface portion of the semiconductor wafer and contains carbon, hydrogen, and nitrogen as a solid solution within the semiconductor wafer; and
an epitaxial layer formed on the modified layer,
wherein a peak concentration in a carbon concentration profile in a depth direction of the modified layer is $1\times10^{18}$ atoms/cm$^3$ or more and $1\times10^{21}$ atoms/cm$^3$ or less,
a peak concentration in a hydrogen concentration profile in the depth direction of the modified layer is $1\times10^{17}$ atoms/cm$^3$ or more and $1\times10^{19}$ atoms/cm$^3$ or less, and
a peak concentration in a nitrogen concentration profile in the depth direction of the modified layer is $1\times10^{18}$ atoms/cm$^3$ or more and $1\times10^{21}$ atoms/cm$^3$ or less.

6. The semiconductor epitaxial wafer according to claim 5, wherein half widths of the carbon concentration profile, the hydrogen concentration profile, and the nitrogen concentration profile are all 200 nm or less.

7. The semiconductor epitaxial wafer according to claim 5, wherein peak positions in the carbon concentration profile, the hydrogen concentration profile, and the nitrogen concentration profile are all in a depth range of 150 nm or less from a surface of the modified layer.

* * * * *